United States Patent

Buhr et al.

[11] 4,409,314
[45] Oct. 11, 1983

[54] LIGHT-SENSITIVE COMPOUNDS, LIGHT-SENSITIVE MIXTURE, AND LIGHT-SENSITIVE COPYING MATERIAL PREPARED THEREFROM

[75] Inventors: Gerhard Buhr, Koenigstein; Hans Ruckert; Paul Stahlhofen, both of Wiesbaden, all of Fed. Rep. of Germany

[73] Assignee: Hoechst Aktiengesellschaft, Fed. Rep. of Germany

[21] Appl. No.: 313,154

[22] Filed: Oct. 20, 1981

[30] Foreign Application Priority Data

Oct. 24, 1980 [DE] Fed. Rep. of Germany ....... 3040157

[51] Int. Cl.³ .................. G03C 1/60; G03C 1/54; C07C 113/00
[52] U.S. Cl. ...................... 430/192; 260/141; 430/193; 430/326; 430/330
[58] Field of Search .............. 430/192, 193, 165; 260/141 D

[56] References Cited

U.S. PATENT DOCUMENTS

| | | | |
|---|---|---|---|
| 3,046,118 | 7/1962 | Schmidt | 430/192 |
| 3,106,465 | 10/1963 | Neugebauer et al. | 430/193 |
| 3,130,047 | 4/1964 | Uhlig et al. | 430/193 |
| 3,635,709 | 1/1972 | Kobayashi | 430/192 |
| 3,802,885 | 4/1974 | Lawson et al. | 430/192 |
| 4,005,437 | 1/1977 | Ross et al. | 430/192 |
| 4,174,222 | 11/1979 | Komine et al. | 430/190 |

FOREIGN PATENT DOCUMENTS 1458126 12/1976 United Kingdom .

*Primary Examiner*—Charles L. Bowers, Jr.
*Attorney, Agent, or Firm*—James E. Bryan

[57] ABSTRACT

A light-sensitive mixture is described which contains a water-insoluble resinous binder, which is soluble or swellable in aqueous-alkaline solutions, and a novel 1,2-naphthoquinone-2-diazide-sulfonic acid ester of a dihydroxyacylophenone or of a dihydroxybenzoic acid ester of the formula I

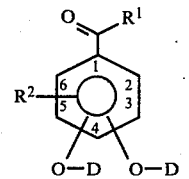

in which $R^1$ is an alkyl or alkoxy radical, the carbon chain of which can be interrupted by ether oxygen atoms, $R^2$ is a hydrogen atom, an alkyl radical having 1–3 carbon atoms, or a chlorine or bromine atom and D is a 1,2-naphthoquinone-2-diazide-sulfonyl radical. The copying materials prepared from this mixture are particularly suitable for the preparation of printing plates which give long print runs and have a high light sensitivity. The compounds of the formula I are distinguished by good solubility in customary coating solvents.

15 Claims, No Drawings

LIGHT-SENSITIVE COMPOUNDS, LIGHT-SENSITIVE MIXTURE, AND LIGHT-SENSITIVE COPYING MATERIAL PREPARED THEREFROM

This invention relates to a positive-working light-sensitive mixture which contains a water-insoluble resinous binder which is soluble or swellable in aqueous-alkaline solutions, and a 1,2-naphthoquinone-2-diazide-sulfonic acid ester of a dihydroxyacylophenone or of a dihydroxybenzoic acid ester.

Mixtures of the generic type indicated are known from German Pat. No. 938,233. The patent describes naphthoquinone-diazide-sulfonic acid esters of substituted polyhydric phenols, all of which contain at least one free unesterified hydroxyl group. Compounds of this type give a relatively short print run and exhibit a relatively poor resistance to developer. Moreover, the partially esterified compounds normally cannot be obtained in a pure form, but only as mixtures of the possible isomers and of products of different degrees of esterification. Solutions of these mixtures in organic solvents can be subject to changes, because less soluble constituents crystallize out and thus interfere with the coating of printing plates or printed circuit boards. More recently, completely esterified phenol derivatives therefore have been preferred, in particular those containing more than one naphthoquinone-diazide-sulfonic acid ester group in the molecule, because these derivatives give longer print runs and have an improved resistance to developer.

Compounds of this type are described in German Offenlegungsschrift No. 1,904,764. These comounds, in particular the tris-1,2-naphthoquinone-2-diazide-sulfonic acid ester of 2,3,4-trihydroxy-benzophenone, recently have been used industrially on a large scale, because of their advantageous copying and printing properties. However, they have the disadvantage of a relatively low solubility in organic solvents, in particular in the glycol monoethers and ester solvents, which are preferred in industry.

Japanese Laid-Open Application No. 51/139,402 discloses the use of esters obtained from 3 moles of 1,2-naphthoquinone-2-diazide-sulfonic acids and 1 mole of gallic acid alkyl esters in combination with novolaks for the preparation of positive-working light-sensitive materials, in particular of photoresist layers. The quinone-diazides described in that publication are said to be distinguished by a high light sensitivity and good solubility in organic solvents. Although the solubility is improved by comparison with the quinone-diazides hitherto preferably used for the preparation of offset printing plates, it is still inadequate for many purposes.

It is the object of the present invention to provide a light-sensitive mixture of the generic type indicated at the outset, which is at least comparable, in its technological properties in printing and copying, with the best hitherto known mixtures of this type, and the light-sensitive compounds of which are additionally distinguished by a higher solubility in organic solvents and can be prepared in a simple manner in a chemically homogeneous form. Printing forms prepared with the light-sensitive mixtures should readily accept greasy ink, due to the enhanced oleophilic character. The structure of the light-sensitive compounds in these mixtures should be capable of variation in a simple manner and thus be adaptable to the most diverse applications.

The starting point of the invention is a light-sensitive mixture which contains a water-insoluble binder, which is soluble or at least swellable in aqueous-alkaline solutions, and a 1,2-naphthoquinone-2-diazide-sulfonic acid ester of a dihydroxyacylophenone or of a dihydroxybenzoic acid ester.

The object is achieved when the ester corresponds to the formula I

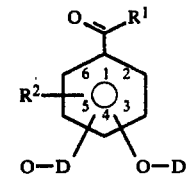

in which $R^1$ is an alkyl or alkoxy radical, the carbon chain of which can be interrupted by ether oxygen atoms, $R^2$ is a hydrogen atom, an alkyl radical having 1–3 carbon atoms, or a chlorine or bromine atom, preferably a hydrogen atom, and D is a 1,2-naphthoquinone-2-diazide-sulfonyl radical.

According to the invention, a light-sensitive copying material, in particular for the preparation of printing plates and photoresists, is also provided, which copying material is composed of a support and a light-sensitive layer which contains a water-insoluble resinous binder, which is soluble or swellable in aqueous-alkaline solutions, and a 1,2-naphthoquinone-2-diazide-sulfonic acid ester of a dihydroxyacylophenone or of a dihydroxybenzoic acid ester, wherein the sulfonic acid ester corresponds to the formula I

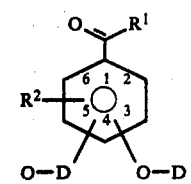

in which $R^1$ is an alkyl or alkoxy radical, the carbon chain of which can be interrupted by ether oxygen atoms, $R^2$ is a hydrogen atom, an alkyl radical having 1–3 carbon atoms, or a chlorine or bromine atom, preferably a hydrogen atom, and D is a 1,2-naphthoquinone-2-diazide-sulfonyl radical.

The naphthoquinone-diazide compounds contained in the mixture according to the invention are novel. They are prepared in accordance with known processes, by esterifying the corresponding dihydroxy compounds with reactive naphthoquinone-diazide-sulfonic acid derivatives, for example the acid chloride. The preferred processes used involve reactions in inert solvents, such as ketones, esters or chlorinated hydrocarbons, in the presence of tertiary amines, such as pyridine, dimethylaniline or triethylamine. The naphthoquinone-diazide-sulfonic acid esters can, however, also be prepared in organic-aqueous solutions, for example in mixtures of dioxane or acetone with aqueous sodium carbonate solution or sodium bicarbonate solution.

The dihydroxybenzoic acid esters are prepared, analogously to known processes, by esterifying the acid in the presence of an excess of the alcohol to be esterified, with acid catalysis, the water of reaction being distilled off or being removed azeotropically in the presence of an entrainer, for example benzene, toluene, chlorobenzene, anisole or-in the case of long-chain alcohols-also nitrobenzene. The dihydroxyacylophenones are advantageously obtained, as described in Houben-Weyl, Methoden der organischen Chemie (*Methods of Organic Chemistry*), Volume VII/2a, pages 47 and 281 et seq., by C-acylation of dihydroxybenzenes which are reacted with carboxylic acids or reactive carboxylic acid derivatives in the presence of Friedel-Crafts catalysts, advantageously in a diluent. Aluminum chloride, zinc chloride, boron trifluoride, hydrogen fluoride, perchloric acid and also polyphosphoric acid have proved to be suitable as catalysts. Examples of diluents are carbon disulfide, 1,2-dichloro-ethane, chlorobenzene or nitrobenzene. In another advantageous method of preparation of the dihydroxyacylophenones, an acid halide is allowed to react with the dihydroxybenzene and the product is then further reacted in the presence of aluminum chloride.

Preferred compounds of the formula I are those derivatives of 2,4-dihydroxy-acylophenones, in which $R^1$ is an alkyl group having 4–17, in particular 7–12, carbon atoms and $R^2$ is a hydrogen atom. Further advantageous compounds are the bis-1,2-naphthoquinone-2-diazide-sulfonic acid esters of dihydroxybenzoic acid alkyl esters, in which the alkyl group has 4–17 carbon atoms, some of which can be replaced by oxygen atoms, and $R^2$ is a hydrogen atom.

The sulfonic acid ester group of the 1,2-naphthoquinone-2-diazide derivatives is in general in the 4-position or 5-position of the napthoquinone-diazide, and the 5-sulfonic acid esters are preferred.

In addition to the compounds mentioned in the examples, it is possible to use, for example, the bis-1,2-naphthoquinone-2-diazide-4- and, in particular, -5-sulfonic acid esters of the following dihydroxyacylophenones or dihydroxybenzoic acid esters: methoxyethyl 3,5-dihydroxy-benzoate, 2,5-dihydroxy-1-(3-methylbutanoyl)-benzene, hexyl 3,4-dihydroxy-benzoate, 2,4-dihydroxy-1-(4-methyl-pentanoyl)-benzene, 2,5-dihydroxy-1-octanoyl-benzene, 2-butoxyethyl 2,4-, 2,5-, 3,4- and 3,5-dihydroxybenzoate, 2,4-dihydroxy-1-decanoyl-benzene, 2,4-dihydroxy-1-(3,5,5-trimethyl-hexanoyl)-benzene, 3,6-dioxa-heptyl, 3,4-dihydroxy-benzoate, 3,6,9-trioxa-tridecyl 3,5-dihydroxy-benzoate, decyl 3,4-dihydroxy-benzoate and dodecyl 2,5-dihydroxy-benzoate.

2,5-Dihydroxy-4-methyl- or -4-propyl-1-hexadecanoylbenzene as well as suitable alkyl esters of 5-chloro- or 5-bromo-2,4-dihydroxy-benzoic acid also can be used.

The concentration of the new naphthoquinone-diazide-sulfonic acid esters in the light-sensitive layer can vary within relatively wide limits. In general, the proportion is 3 to 50%, preferably between 7 and 35%, based upon the weight of the non-volatile constituents of the light-sensitive mixture. If appropriate, a part of the novel naphthoquinone-diazide derivatives also can be replaced within the scope of these quantitative ranges by a corresponding amount of a known naphthoquinone-diazide, but the quantitative proportion of the novel compound preferably should predominate.

The light-sensitive mixtures according to the invention also contain a polymeric, water-insoluble resinous binder which dissolves in the solvents used for the mixture according to the invention and is also soluble or at least swellable in aqueous alkalies.

The novolak condensation resins, which have proved suitable in many positive-copying materials based on naphthoquinone-diazides, were found to be particularly useful and advantageous as an additive also in the mixtures according to the invention, which contain the new naphthoquinone-diazide-sulfonic acid esters. They promote a sharp differentiation between the exposed and unexposed layer areas on developing, and this is particularly true of the more highly condensed resins with substituted phenols, for example cresols, as the partners for the condensation with formaldehyde. The nature and quantity of the novolak can differ, depending upon the intended purpose; novolak proportions of between 95 and 50, particularly preferably 90–65, percent by weight based on total solids are preferred. Additionally, numerous other resins also can be co-used, preferably vinyl polymers, such as polyvinyl acetates, polyacrylates, polyvinyl ethers, polyvinylpyrrolidones and the copolymers of the monomers on which these are based. The most advantageous proportion of these resins depends on the technological requirements and the influence of the development conditions, and in general it is not more than 20% by weight of the alkali-soluble resin. For special requirements, such as flexibility, adhesion, gloss, coloration and color change and the like, the light-sensitive mixture also can contain small quantities of substances, such as polyglycols, cellulose derivatives, such as ethylcellulose, wetting agents, dyes, adhesion-promoters and finely divided pigments, and also UV absorbers, if required. Further alkali-soluble binders, or binders which are swellable in alkali, are natural resins, such as shellac and colophony, and synthetic resins, such as copolymers of styrene and maleic anhydride or copolymers of acrylic acid or methacrylic acid, in particular with acrylates or methacrylates.

To coat a suitable support, the mixtures are in general dissolved in a solvent. The selection of the solvents should be matched to the intended coating process, the layer thickness and the drying conditions. Ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl and monomethyl ether, and esters, such as butyl acetate, are suitable solvents for the mixture according to the invention. It is also possible to use mixtures which additionally, for special purposes, also can contain solvents such as acetonitrile, dioxane or dimethylformamide. In principle, all those solvents can be used which do not irreversibly react with the layer components.

In most cases, metals are used as the supports for layer thicknesses of less than about 10 μm. The following can be used for offset printing plates: bright-rolled, mechanically or electrochemically roughened and, if appropriate, anodized aluminum which also can have been additionally pretreated chemically, for example with polyvinylphosphonic acid, silicates or phosphates, and also multi-metal plates with Cu/Cr or brass/Cr as the top layer. For the preparation of letterpress plates, the mixtures according to the invention can be applied to zinc or magnesium plates, or to commercially available microcrystalline alloys thereof, for single-stage etching processes, and also to etchable plastics, such as polyoxymethylene. Due to their good adhesion and etch resistance on copper and nickel surfaces, the mixtures according to the invention are suitable for gravure printing forms or screen-printing forms. Likewise, the mixtures according to the invention can be used as photoresists in the manufacture of printed circuit boards, microelectronic devices, and in chemical milling.

In further applications, other supports, such as wood, paper, ceramics, silicon, silicon dioxide, silicon nitride, textiles and other metals also can be used.

The preferred supports for thick layers of more than 10 μm are plastic films which then serve as temporary supports for transfer layers. For this purpose and for color-test films, polyester films, for example those of polyethylene terephthalate, are preferred. However, polyolefin films such as polypropylene, also are suitable.

Coating of the support material is carried out in known manner by whirler-coating, spraying, dipping, rolling, by means of slot dies, blade application or roller application. Finally, the coating of, for example, printed circuit boards, glass or ceramics and silicon disks, also can be effected by layer transfer from a temporary support.

The light sources customary in industry are used for exposure. Electron irradiation is also a possibility for providing an image.

The aqueous-alkaline solutions of stepped alkalinity, which are used for developing and which also can contain minor amounts of organic solvents or wetting agents, remove those areas of the copying layer which have been struck by the light, and thus produce a positive image of the original.

The preferred use of the light-sensitive mixtures according to the invention is in the preparation of printing forms, in particular offset printing forms, autotype gravure printing forms and screen-printing forms, in copying lacquers and in so-called dry resists.

The printing plates prepared with the use of the novel compounds have a high light-sensitivity in practice and an improved resistance to alkaline developers. The preferred compounds themselves are distinguished by good to excellent solubility in the customary organic solvents and by good compatibility with the constituents of the copying layer.

For a further enhancement of the resistance on printing and the resistance to wash-out agents, correcting agents and printing inks which can be cured by UV light, the developed plates can be briefly heated to an elevated temperature, as is known from British Pat. No. 1,154,749.

Examples of the mixture according to the invention are given below. Initially, a number of new bis-(1,2-naphthoquinone-2-diazide-sulfonic acid esters) of dihydroxy-acylophenones and dihydroxybenzoic acid esters are listed in Tables 1 and 2; these compounds were tested as the light-sensitive components in mixtures according to the invention. The numbering of the new compounds from 1 to 18 is retained in the application examples. Percentage ratios and quantity ratios are to be understood as weight units, unless otherwise stated. Parts by weight (p.b.w.) and parts by volume (p.b.v.) have the same relationship as the g to the ml.

TABLE 1

Ketones of the general formula I with OD groups in the 2-position and 4-position, and with $R^2$ = H. D is a 1,2-naphthoquinone-2-diazide-4- or -5-sulfonyl radical. The numbers under D denote the place of substitution.

| Compound | $R^1$ | D | % N calculated | found |
|---|---|---|---|---|
| 1 | Methyl | 5 | 9.1 | 9.1 |
| 2 | n-Butyl | 5 | 8.5 | 8.5 |
| 3 | Hept-3-yl | 5 | 8.0 | 8.0 |

TABLE 1-continued

Ketones of the general formula I with OD groups in the 2-position and 4-position, and with $R^2$ = H. D is a 1,2-naphthoquinone-2-diazide-4- or -5-sulfonyl radical. The numbers under D denote the place of substitution.

| Compound | $R^1$ | D | % N calculated | found |
|---|---|---|---|---|
| 4 | Hept-3-yl | 4 | 8.0 | 8.4 |
| 5 | 2,4,4-trimethyl-pentyl | 5 | 7.85 | 7.9 |
| 6 | 2,4,4-Trimethyl-pentyl | 4 | 7.85 | 8.2 |
| 7 | n-Pentadecyl | 5 | 6.9 | 7.0 |
| 8 | n-Pentadecyl | 4 | 6.9 | 7.0 |
| 9 | n-Heptadecyl | 5 | 6.7 | 6.8 |

TABLE 2

Esters of the general formula I with $R^2$ = H and $R^1$ = alkoxy. D is a 1,2-naphthoquinone-2-diazide-4- or -5-sulfonyl radical. The numbers in the column under D denote the position of the sulfonyl group in the naphthoquinone nucleus, and the numbers in the "substitution" column denote the positions of the OD groups in the benzene nucleus of the formula I.

| Compound | $R^1$ | D | Substitution | % N calculation | % N found |
|---|---|---|---|---|---|
| 10 | Methoxy | 5 | 2,4 | 8.9 | 8.9 |
| 11 | i-Amyloxy | 4 | 2,4 | 8.1 | 7.8 |
| 12 | i-Amyloxy | 5 | 2,5 | 8.1 | 8.2 |
| 13 | i-Amyloxy | 5 | 3,4 | 8.1 | 8.2 |
| 14 | 2-Ethoxyethoxy | 5 | 3,4 | 8.1 | 8.1 |
| 15 | 2-Ethoxyethoxy | 4 | 3,4 | 8.1 | 8.0 |
| 16 | 2-Ethoxyethoxy | 5 | 3,5 | 8.1 | 8.0 |
| 17 | n-Dodecyloxy | 5 | 2,4 | 7.1 | 7.0 |
| 18 | n-Dodecyloxy | 5 | 3,5 | 7.1 | 7.2 |

The good solubility of the new bis-naphthoquinone-diazide derivatives of dihydroxyacylophenones and dihydroxybenzoic acid esters was proved by comparative experiments, those representatives standing out with advantage which are substituted by aliphatic radicals of medium to long length. The comparison used was the tris-1,2-naphthoquinone-2-diazide-5-sulfonic acid ester of 2,3,4-trihydroxy-benzophenone (compound V) which is widely employed in industry, but the solubility of which is not satisfactory in all applications.

In each case, 1 to 4 g of crystalline diazo compound were stirred in 25 g of ethylene glycol monomethyl ether, which is the most important solvent in coating technology, for 2 hours at room temperature and the mixture was allowed to stand for a further 70 hours without stirring, in order to complete the crystallization of possible amorphous constituents. The mixture was then filtered off with suction, and the filter residue was washed successively with 10 ml of methanol and 10 ml of ether, dried in vacuo, and its weight was determined. The solubilities in ethylene glycol monomethyl ether, listed in Table 3, were calculated from the difference relative to the quantity employed.

TABLE 3

Solubilities of various naphthoquinone-diazides

| Compound No. | Solubility (%) |
|---|---|
| V | 1.0 |
| 1 | 1.03 |
| 10 | 0.87 |
| 2 | >10.7[1] |
| 3 | >13.8[1] |
| 4 | 4.3 |
| 5 | >10.7[1] |
| 6 | 10.5 |
| 11 | 2.3 |
| 13 | 4.7 |
| 14 | 4.3 |
| 15 | 3.7 |

TABLE 3-continued

Solubilities of various naphthoquinone-diazides

| Compound No. | Solubility (%) |
|---|---|
| 16 | 5.0 |
| 17 | 7.5 |
| 18 | 4.6 |

[1] 3 g of compounds 2 and 5, and 4 g of compound 3, gave a clear solution in ethylene glycol monomethyl ether and did not show any precipitations even after 3 days. In a further widely used solvent, namely n-butyl acetate, the following solubilities were determined. In each case, 1 g of the crystalline diazo compound was stirred for 2 hours in 25 g of n-butyl acetate. The mixtures were then worked up as in Example 1.

TABLE 4

Solubilities of various naphthoquinone-diazides in butyl acetate

| Compound No. | Solubility (%) |
|---|---|
| V | 0.50 |
| 7 | 1.03 |
| 8 | 1.75 |
| 17 | 2.03 |

EXAMPLE 1

An electrolytically roughened and anodized aluminum foil was whirler-coated with a coating solution composed of:

6.3 parts by weight of cresol/formaldehyde novolak (melting range 105°–120° C. according to DIN 53,181),
1.2 parts by weight of compound 2,
0.07 part by weight of crystal violet base,
0.17 part by weight of 1,2-naphthoquinone-2-diazide-4-sulfonic acid chloride,
0.25 part by weight of a maleate resin (melting range 135°–145° C., acid number 15–25), and
92.01 parts by weight of a mixture of 3 parts by weight of ethylene glycol monomethyl ether and 2 parts by weight of butyl acetate in such a way that, after drying, a layer weight of 2.5 g/m² resulted. The coated printing plate was exposed for 60 seconds at a distance of 110 cm through a diapositive under a 5 kW metal halide lamp and developed with the developer of the following composition
5.5 parts by weight of sodium metasilicate×9H$_2$O,
3.4 parts by weight of trisodium phosphate×12H$_2$O,
0.4 part by weight of anhydrous sodium dihydrogen phosphate, and
90.7 parts by weight of water
the exposed layer areas being removed. A printing test with an offset printing form thus prepared was stopped after 150,000 prints of still perfect quality. A similar result was obtained when compound 2 in the above formulation was replaced by equal quantities of compound 4, 5, or 6.

EXAMPLE 2

To prepare a positive dry resist,
11.15 parts by weight of the novolak according to Example 1,
2.79 parts by weight of a vinyl acetate/crotonic acid copolymer (95:5) of a molecular weight of 100,000,
4.18 parts by weight of a copolymer of n-hexyl methacrylate, methyl methacrylate and methacrylic acid (5:1:2) having an acid number of 158,
1.86 parts by weight of polyethylene glycol, molecular weight 2,000,
2.79 parts by weight of an epoxide resin having an epoxy equivalent weight of 190,
4.32 parts by weight of compound 4,
0.45 part by weight of 1,2-naphthoquinone-2-diazide-4-sulfonic acid chloride and
0.06 part by weight of crystal violet
were dissolved in
46.50 parts by weight of ethylene glycol monoethyl ether and
25.90 parts by weight of methyl ethyl ketone.

An approximately 25 μm thick polyester film which had been pretreated with an aqueous solution of 10% of trichloroacetic acid, 1% of polyvinyl alcohol and 0.1% of wetting agent was coated with the above solution and dried. To provide protection against dust and scratches, a polyethylene cover film was then applied to the about 20 μm thick resist layer.

For the manufacture of printed circuit boards, the positive dry resist film was, after peeling off the cover film, laminated in a commercially available laminator onto a cleaned, about 35 μm thick copper foil which was laminated onto a support of an insulating material. After peeling off the support film, further drying if necessary, about 3 minutes' exposure with the apparatus described in Example 1 and about 2 minutes' spray development with a developer of the following composition
0.6 part by weight of NaOH,
0.5 part by weight of sodium metasilicate×5H$_2$O,
1.0 part by weight of n-butanol and
97.9 parts by weight of water, an excellent imagewise resist layer was obtained. It withstood not only the conditions of etching processes, for example etching with FeCl$_3$, but it was also resistant to electroplating in the manufacture of through-hole plated circuits, in particular during the successive electrolytic build-up of copper, nickel and gold. When compound 4 was replaced by the same quantity of compound 15, virtually the same results were obtained.

EXAMPLE 3

Compound 3 was employed for the preparation of a photoresist solution which is used for the manufacture of so-called chemically milled parts.

For this purpose, the following were dissolved in 67.9 parts by weight of 2-butanone:
12.0 parts by weight of the novolak according to Example 1,
5.0 parts by weight of a polyethyl acrylate solution (40% in toluene, Plexisol B 574, Messrs. Röhm),
5.0 parts by weight of a polyvinyl ethyl ether of low viscosity,
7.0 parts by weight of compound 3,
3.0 parts by weight of the vinyl acetate/crotonic acid copolymer according to Example 2, and
0.1 part by weight of crystal violet.

For the efficient production of small components for electrical switches, an about 0.5 mm thick sheet of a special copper alloy was processed, instead of by mechanical punching, with the above solution as follows: the sheet was coated by immersion in the above solution, dried, exposed on both sides with mutually congruent positive film originals of the desired milled component, developed under aqueous-alkaline conditions and etched on both sides by spraying, for example, with ferric chloride solution. This chemical milling technique is particularly useful when the image of the metal component, for example a spring reed is copied as a group, that is to say, in a relatively large number in one working step. Advantageously, small lands are left between the individual recurring patterns so that, at the end of etching, the individual components still hang together and are obtained as mechanically separated parts only after rinsing.

The copying lacquer layer described, containing these special diazo compounds, is distinguished by its versatile applicability on numerous different metal surfaces. It shows good adhesion and reliable copying properties as well as etch resistance against many etching solutions which, depending upon the alloy, also can contain sulfuric acid, hydrofluoric acid, chromic acid, hydrogen peroxide and other compounds.

EXAMPLE 4

A solution of
3.1 parts by weight of compound 2,
21.0 parts by weight of a phenol/formaldehyde novolak having a melting range of 110°–120° C. (according to the DIN 53,181 capillary method),
3.5 parts by weight of an epoxide resin (epoxy equivalent weight of about 450) and
0.4 part by weight of Sudan Blue II (C.I. Solvent Blue 35) in
50.0 parts by weight of ethylene glycol monoethyl ether-acetate,
12.0 parts by weight of ethylene glycol monoethyl ether and
10.0 parts by weight of butyl acetate gave a positive copying lacquer which was suitable for the production of printed circuit boards or copper gravure printing cylinders, or for nickel electroplating stencils.

The developer of Example 2, diluted with water if required, was used for development.

In place of compound 2, it was possible to use compound 3 with the same result.

EXAMPLE 5

Color test films, for multi-color offset copying were prepared by coating a 100 μm thick polyester film with a solution of
27.1 parts by weight of the novolak according to Example 1,
6.8 parts by weight of the vinyl acetate/crotonic acid copolymer according to Example 2,
18.6 parts by weight of compound 14,
13.6 parts by weight of the polyethyl acrylate solution as in Example 3,
23.7 parts by weight of a polyvinyl ethyl ether of low viscosity and
10.2 parts by weight of the yellow dye Auramine O (C.I. 41,000)
in ethylene glycol monoethyl ether in such a way that the layer thickness after drying was 1 μm. Instead of the yellow dye, equal quantities of the dyes Victoria Pure Blue FGA (C.I. Basic Blue 81) and Grasol Fast Ruby 2 Bl (C.I. Solvent Red 128) were used for the corresponding blue and red color films.

After exposure under positive originals, advantageously the corresponding color separations for a multi-color print, and development in the developer of Example 1, diluted 1:1 with water, colored copies of the originals used were obtained.

The same results were obtained, when compound 14 was replaced by an equal quantity of compound 16.

EXAMPLE 6

1.18 parts by weight of compound 7,
5.70 parts by weight of the novolak according to Example 1,
0.40 part by weight of 2,3,4-trihydroxy-benzophenone,
0.10 part by weight of 4-(p-tolylmercapto)-2,5-diethoxybenzene-diazonium hexafluorophosphate and
0.06 part by weight of crystal violet were dissolved in a solvent mixture of
52.6 parts by weight of ethylene glycol monomethyl ether and
40.0 parts by weight of tetrahydrofuran.

An electrolytically roughened and anodized aluminum plate, which had been treated with an aqueous solution of polyvinylphosphonic acid, was coated with this solution. The offset printing form prepared with this plate, in a manner corresponding to Example 3, was suitable for the range of very long print runs. The printing layer was distinguished by excellent ink acceptance. Similar results were obtained when, in place of compound 7, the same parts by weight of compounds 8, 9, 17, or 18 were used.

EXAMPLE 7

A positive-working offset printing plate was prepared by applying a layer of the following composition:
78.0 parts by weight of the novolak according to Example 1,
20.0 parts by weight of compound 13,
1.5 parts by weight of 2-(4-ethoxy-naphth-1-yl)-4,6-bis-trichloromethyl-s-triazine, and
0.5 part by weight of crystal violet base
to a mechanically roughened aluminum foil in the customary manner.

The plate was used for the medium range of print runs. In place of compound 13, equal amounts by weight of compounds 11, 12 or mixtures of these compounds also can be used.

EXAMPLE 8

For the manufacture of micro-electronic switch elements of high packing density, a commercially available silicon disk, which had been polished in the customary manner and provided with a 0.2 μm thick $SiO_2$ layer by oxidation, was coated with the following positive photoresist.
18 parts by weight of the novolak according to Example 1 and
4 parts by weight of compound 2
were dissolved in 70 parts by weight of a solvent mixture of ethylene glycol ethyl ether-acetate, butyl acetate and xylene (8:1:1 parts by volume) and filtered through a 0.5 μm filter.

By whirler-coating of the support at 9,000 revolutions per minute, a resist layer of about 0.9 μm thickness was obtained, and this was dried for a further 10 minutes at 90° C. in a circulating air cabinet.

After cooling and conditioning under defined climatic conditions of 23° C. and 40–50% relative humidity, exposure was carried out for about 6 seconds, using a 200 watt Hg high-pressure lamp, in a wafer contact-exposure apparatus under a commercially available chromium mask with highly resolved test fields.

Development was carried out at 25° C. in a moving developer composed of
2.67% of sodium metasilicate×9 water,
1.71% of trisodium phosphate×12 water and
0.17% of sodium dihydrogen phosphate, dissolved in 95.45% of water.

What is claimed is:

1. A light-sensitive mixture which contains a water-insoluble resinous binder, which is soluble or swellable in aqueous-alkaline solutions, and a 1,2-naphthoquinone-2-diazide-sulfonic acid ester of a dihydroxyacylophenone or of a dihydroxybenzoic acid ester, wherein the sulfonic acid ester corresponds to the formula I

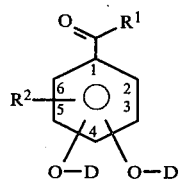

in which $R^1$ is an alkyl radical having 4 to 17 carbon atoms or an alkoxy radical having 4 to 17 carbon atoms, the carbon chain of which can be interrupted by ether oxygen atoms, $R^2$ is a hydrogen atom, an alkyl radical having 1 to 3 carbon atoms, or a chlorine or bromine atom, and D is a 1,2-naphthoquinone-2-diazide-sulfonyl radical.

2. A light-sensitive mixture as claimed in claim 1 which contains a compound of the formula I in which $R^1$ is an alkyl radical having 4–17 carbon atoms.

3. A light-sensitive mixture as claimed in claim 1 which contains 2,4-bis-(1,2-naphthoquinone-2-diazide-5-sulfonyl)phenyl n-butyl ketone.

4. A light-sensitive mixture as claimed in claim 1 which contains 2,4-bis-(1,2-naphthoquinone-2-diazide-5-sulfonyl) phenyl hept-3-yl ketone.

5. A light-sensitive mixture as claimed in claim 1 which contains 2,4-bis-(1,2-naphthoquinone-2-diazide-5-sulfonyl) phenyl 2,4,4-trimethyl-pentyl ketone.

6. A light-sensitive mixture as claimed in claim 1 wherein the binder is a phenolic resin.

7. A light-sensitive mixture as claimed in claim 1 which contains about 3–50 percent by weight, based upon its non-volatile constituents, of the compound of the formula I.

8. A light-sensitive mixture as claimed in claim 1 which contains a compound of the formula I, in which $R^2$ is a hydrogen atom and D is a 1,2-naphthoquinone-2-diazide-4- or -5-sulfonyl radical.

9. A light-sensitive copying material, composed of a support and a light-sensitive layer which contains a water-insoluble resinous binder, which is soluble or swellable in aqueous-alkaline solutions, and a 1,2-naphthoquinone-2-diazide-sulfonic acid ester, wherein the sulfonic acid ester corresponds to the formula I

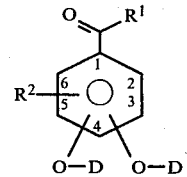

in which $R^1$ is an alkyl radical having 4 to 17 carbon atoms or an alkoxy radical having 4 to 17 carbon atoms, the carbon chain of which can be interrupted by ether oxygen atoms, $R^2$ is a hydrogen atom, an alkyl radical having 1 to 3 carbon atoms, or a chlorine or bromine atom and D is a 1,2-naphthoquinone-2-diazide-sulfonyl radical.

10. A 1,2-naphthoquinone-2-diazide-sulfonic acid ester of a dihydroxyacylophenone or of a dihydroxybenzoic acid ester, wherein the sulfonic acid ester corresponds to the formula I

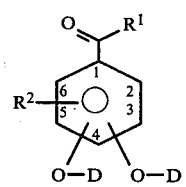

in which $R^1$ is an alkyl radical having 4 to 17 carbon atoms or an alkoxy radical having 4 to 17 carbon atoms, the carbon chain of which can be interrupted by ether oxygen atoms, $R^2$ is a hydrogen atom, an alkyl radical having 1–3 carbon atoms, or a chlorine or bromine atom and D is a 1,2-naphthoquinone-2-diazide-sulfonyl radical.

11. A compound as claimed in claim 10 in which $R^1$ is an alkyl radical having 4–17 carbon atoms.

12. A compound as claimed in claim 10 in which $R^2$ is a hydrogen atom and D is a 1,2-naphthoquinone-2-diazide-4- or -5-sulfonyl radical.

13. 2,4-bis-(1,2-naphthoquinone-2-diazide-5-sulfonyl) phenyl n-butyl ketone.

14. 2,4-bis-(1,2-naphthoquinone-2-diazide-5-sulfonyl) phenyl hept-3-yl ketone.

15. 2,4-bis-(1,2-naphthoquinone-2-diazide-5-sulfonyl) phenyl 2,4,4-trimethyl-pentyl ketone.

* * * * *